US008278955B2

(12) United States Patent
Palaniappa et al.

(10) Patent No.: US 8,278,955 B2
(45) Date of Patent: Oct. 2, 2012

(54) TEST INTERCONNECT

(75) Inventors: Illavarasan M. Palaniappa, Chandler, AZ (US); Kanapathipillai Prabakaran, Queen Creek, AZ (US)

(73) Assignee: Interconnect Devices, Inc., Kansas City, KS (US)

( * ) Notice: Subject to any disclaimer, the term of this patent is extended or adjusted under 35 U.S.C. 154(b) by 103 days.

(21) Appl. No.: 12/054,281

(22) Filed: Mar. 24, 2008

(65) Prior Publication Data

US 2009/0237097 A1    Sep. 24, 2009

(51) Int. Cl.
G01R 1/067 (2006.01)
G01R 31/00 (2006.01)
(52) U.S. Cl. .......... 324/756.02; 324/755.01; 324/756.04
(58) Field of Classification Search .............. 324/755, 324/756.01, 756.02
See application file for complete search history.

(56) References Cited

U.S. PATENT DOCUMENTS

| | | | |
|---|---|---|---|
| 4,793,814 A | 12/1988 | Zifcak et al. | |
| 5,096,426 A * | 3/1992 | Simpson et al. | 439/66 |
| 5,360,348 A | 11/1994 | Johnson | |
| 5,749,738 A | 5/1998 | Johnson et al. | |
| 5,899,755 A | 5/1999 | Kline | |
| 5,938,451 A | 8/1999 | Rathburn | |
| 5,947,749 A * | 9/1999 | Rathburn | 439/66 |
| 6,154,040 A | 11/2000 | Tsukamoto et al. | |
| 6,203,329 B1 | 3/2001 | Johnson et al. | |
| 6,244,874 B1 | 6/2001 | Tan | |
| 6,297,653 B1 | 10/2001 | Hembree | |
| 6,529,025 B1 | 3/2003 | Kline | |
| 6,561,819 B1 * | 5/2003 | Huang et al. | 439/66 |
| 6,854,981 B2 | 2/2005 | Nelson | |
| 7,059,866 B2 | 6/2006 | Gilk | |
| 7,202,686 B2 * | 4/2007 | Sakiyama | 324/756.02 |
| 7,303,404 B2 * | 12/2007 | Osato et al. | 439/71 |
| 7,338,293 B2 | 3/2008 | Gilk | |
| 7,381,060 B2 * | 6/2008 | Ju | 439/66 |
| 7,445,465 B2 | 11/2008 | Lopez et al. | |
| 7,619,425 B2 * | 11/2009 | Kimura | 324/754 |
| 7,625,219 B2 * | 12/2009 | Osato et al. | 439/71 |
| 7,639,026 B2 | 12/2009 | Shell et al. | |
| 7,737,708 B2 | 6/2010 | Sherry | |
| 2002/0003424 A1 | 1/2002 | Johnson | |
| 2003/0224663 A1 | 12/2003 | Johnson et al. | |
| 2006/0216962 A1 | 9/2006 | Gilk | |

FOREIGN PATENT DOCUMENTS

WO    WO 2006085388 A1  *  8/2006
WO    WO 2006114895 A1  *  11/2006

* cited by examiner

*Primary Examiner* — Roberto Velez
(74) *Attorney, Agent, or Firm* — Finnegan, Henderson, Farabow, Garrett & Dunner, L.L.P.

(57) ABSTRACT

According to an example embodiment, a contact cell includes a first element that is flexible and electrically conductive, and that is structured to have at least one bend along an entire length of the first element. The contact cell further includes a second element that is flexible and electrically conductive, and that is structured to have at least one bend along an entire length of the second element. The contact cell further includes a tie that is electrically non-conductive, and that is affixed to the first element and affixed to the second element such that the first element and second element are physically and electrically separated from each other.

15 Claims, 4 Drawing Sheets

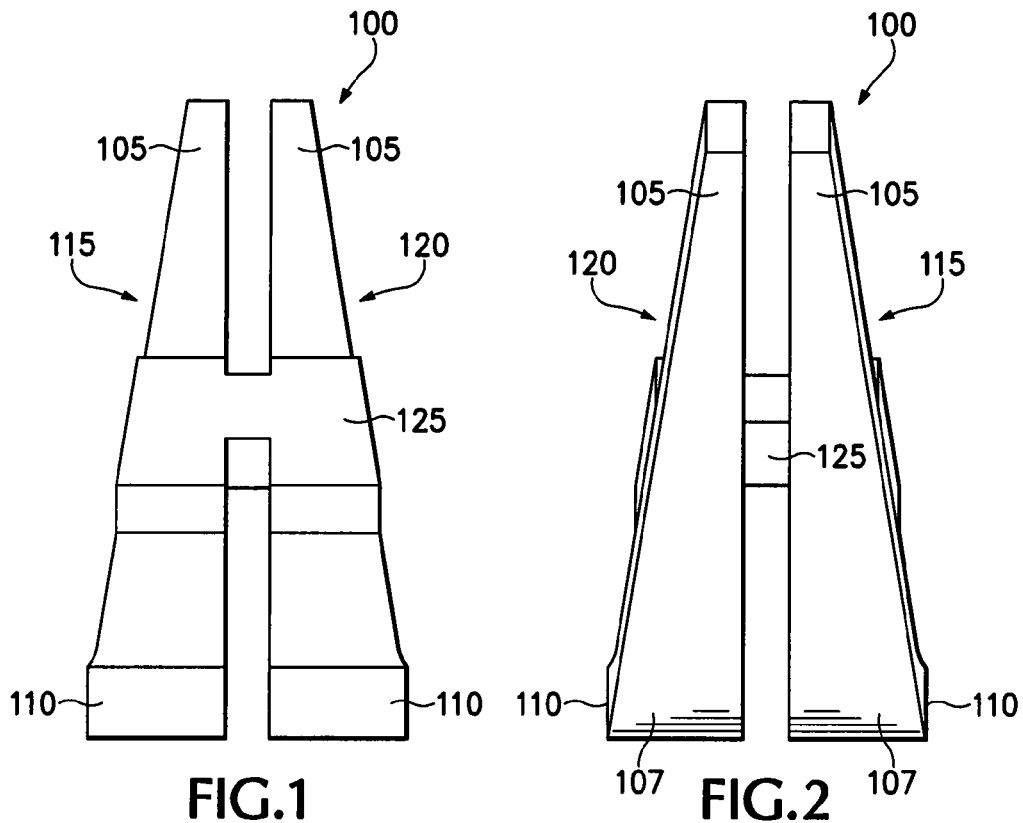
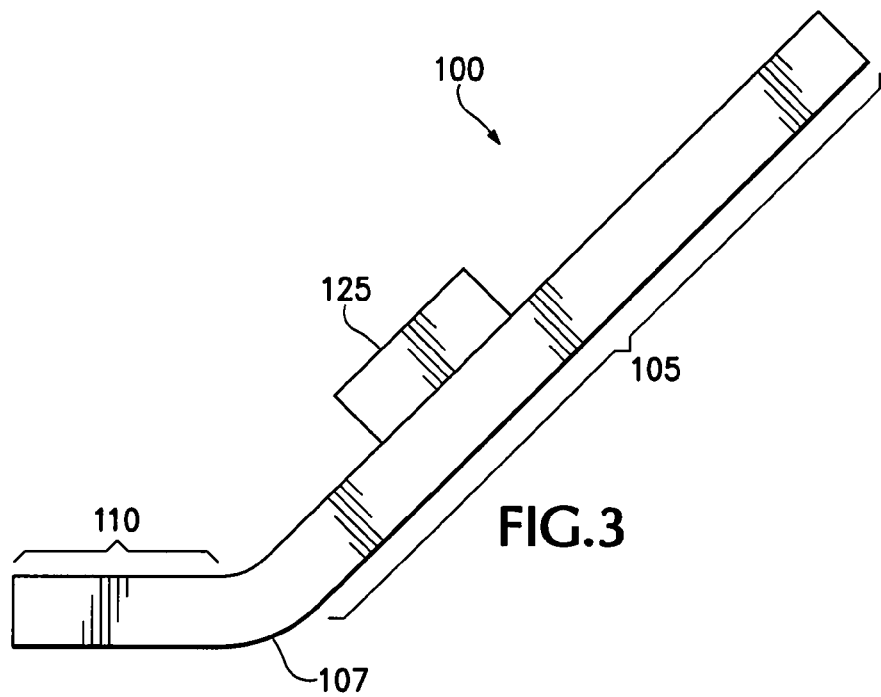

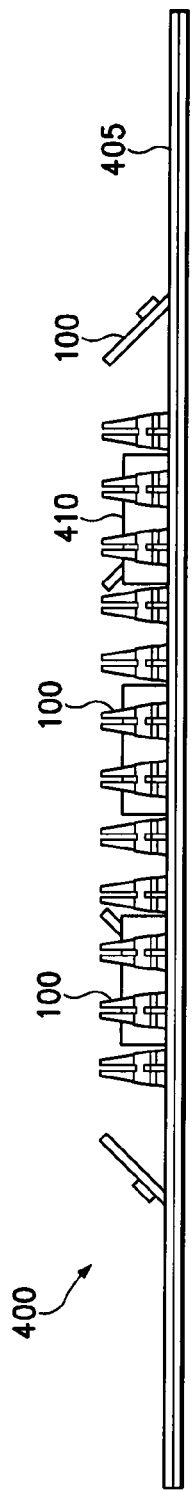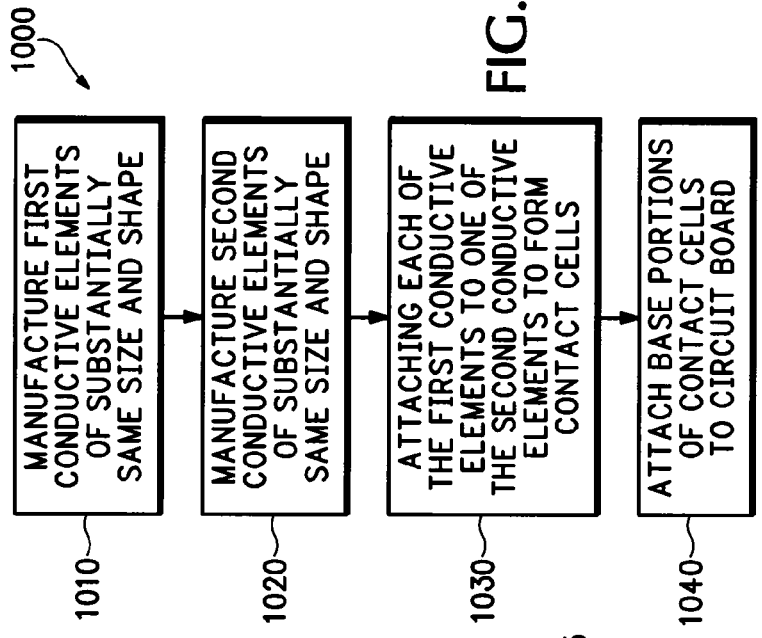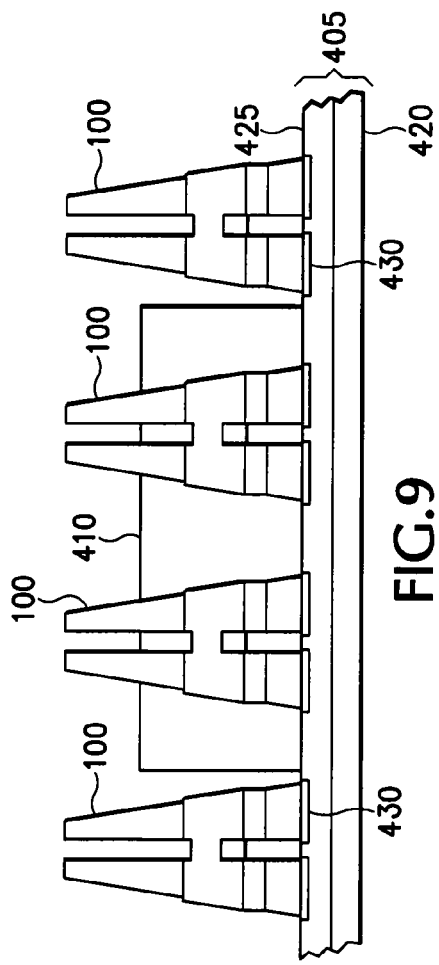

TEST INTERCONNECT

BACKGROUND

1. Technical Field

This disclosure relates to test interconnects for establishing an electrical interconnection between terminals on electronic modules and a test fixture, to test fixtures incorporating such test interconnects, and to methods of manufacturing the same.

2. Description of the Related Art

Electronic modules, such as microprocessors, integrated circuits, memory modules, (generally, "chips") must be tested during the manufacturing process. These modules have multiple terminals or lands, each of which must be connected to appropriate contacts on a printed circuit board incorporated as a part of the test fixture when the module is tested.

Chipmakers often look to measure resistance at 1 mOhms to minimize the affects of the socket and printed circuit board (PCB) on test readings of the latest fine-pitch QFN packages that are sensitive to electrical configurations and peripheral resistance. This is known as Kelvin testing. Kelvin testing generally involves the use of Kelvin clips to establish four electrical connections with a Device Under Test (DUT) to eliminate resistance from a test apparatus.

The continued shrinking, however, of IC packages to produce smaller and faster end-user devices has effectively prevented chipmakers from using traditional Kelvin clips to establish precise production-level Kelvin connections with DUTs to measure performance. Example embodiments address this as well as other limitations of the related art.

BRIEF DESCRIPTION OF THE DRAWINGS

FIG. 1 is a front view diagram of a contact cell according to an example embodiment.

FIG. 2 is a back view diagram of the contact cell of FIG. 1.

FIG. 3 is a profile view diagram of the contact cell of FIG. 1.

FIG. 8 is a front view diagram of the test fixture of FIG. 4.

FIG. 9 is an expanded front view diagram of a portion of the text fixture of FIG. 4.

FIG. 10 is a flowchart illustrating some example processes in a method of manufacturing a test fixture that includes contact cells in accordance with an example embodiment.

DETAILED DESCRIPTION OF EXAMPLE EMBODIMENTS

Figure 4:
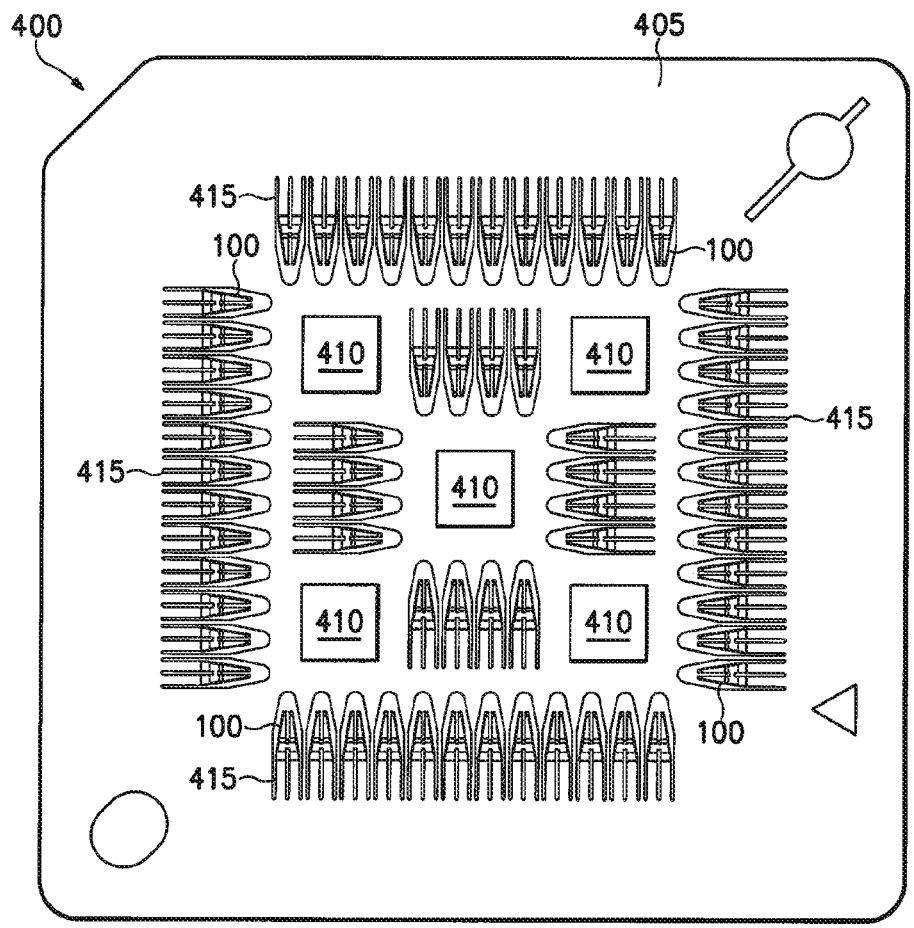
FIG. 4 is a top view diagram of a test fixture including contact cells in accordance with an example embodiment.

FIG. 1 is a front view diagram of a contact cell 100 according to an example embodiment. FIG. 2 is a back view diagram of the contact cell 100. FIG. 3 is a profile view diagram of the contact cell 100.

Referring to FIGS. 1-3, the contact cell 100 includes a first element 115, a second element 120, and a flexible polyimide tie 125. Each of the first and second elements 115, 120 includes a tip 105, a bend 107, and a base 110. The polyimide tie 125 is non-conductive, and is affixed to the first and second elements 115, 120 by adhesive or other suitable means. The tie 125 maintains the first and second elements 115, 120 in the illustrated position, and prevents the tips 105 and bases 110 from separating during use.

The tips 105 of the first and second elements 115, 120 are structured to contact a land or pad of a leadless package (not shown), such as a Quad Flat No lead (QFN) package, a Micro Lead Frame (MLF) package, or a Land Grid Array (LGA) package. Other leadless packages are known, the details of which are not necessary for the understanding of the example embodiments. The bases 110 of the contact cell 100 are structured to contact an appropriate electrical trace (not shown) on a printed circuit board (not shown) that constitutes part of a text fixture incorporating at least one of the contact cells 100.

Each of the first and second elements 115, 120 are electrically conductive and flexible due at least in part to the bend portion 107. FIG. 3 illustrates how the contact cell 100 is arranged on the printed circuit board, with the base 110 proximate to and affixed to the circuit board and the tip 105 extending upwards and away from the base at an angle that is determined by the bend 107.

As will be explained in greater detail below, when a leadless package is inserted into a test fixture that incorporates the contact cell 100, a downward force is applied to the tips 105 of the contact cell 100, and the tips follow a path that is substantially defined by an arc. At some point, the downward travel of the leadless package in the test fixture is limited by a stop, and the contact cell 100 is preferably structured such that its position on the arc corresponds to a position of the appropriate land or pad on the leadless package, therefore establishing physical and electrical contact with the land or pad. When the leadless package is removed from the test fixture, the tips 105 travel upward along the same path. Due to the flexibility of the contact cell 100, the movement of the tips 105 will not break or otherwise damage the contact cell 100.

According to some example embodiments, each one of the first and second elements 115, 120 of the contact cell 100 may be arranged on the circuit board such that each tip 105 contacts the same lead of a leadless package. Alternatively, each tip 105 of the contact cell 100 may be arranged on the circuit board such that they contact different leads of the leadless package. This is possible because the first and second elements 115, 120 are physically and electrically separated by the non-conductive polyimide tie 125.

Preferably, as shown in FIGS. 1 and 2, the tips 105 are substantially narrower than the bases 110. One of the advantages of such an arrangement is that it improves the pointing accuracy of the contact cell and the true position tolerance, which are needed to perform Kelvin testing on the latest fine-pitch leadless packages such as QFNs, MLFs, and LGAs.

FIGS. 1 and 2 also illustrate that the first element 115 is symmetric to the second element 120, and that the tie 125 is affixed to both elements such that the symmetry between the first and second elements is substantially a mirror symmetry about an axis. Although this symmetry is not a strict requirement among all example embodiments, one of the advantages of this symmetry is that each signal path between the tips 105 and the bases 110 is substantially equal. The tie 125 is preferably composed of a flexible polyimide, but other non-conductive materials may also be used. The tie 125 also exhibits a mirror symmetry about the same axis as the first and second elements, but in this case the advantage is related to ease of manufacturing rather than to any electrical length considerations.

As illustrated in FIG. 3, the first and second elements 115, 120 of the contact cell 100 preferably include a single bend 107 between the base 110 and the tip 105, but other example embodiments are not so limited. In other example embodiments, there may be multiple bends between the base 110 and the tip 105, with smaller straight segments between each of the bends. Due to the flexibility provided by one or more bends 107, the contact force delivered to the contact cell 100 is reduced, increasing the lifespan of the contact cell and reducing test-related cost.

Figure 5:
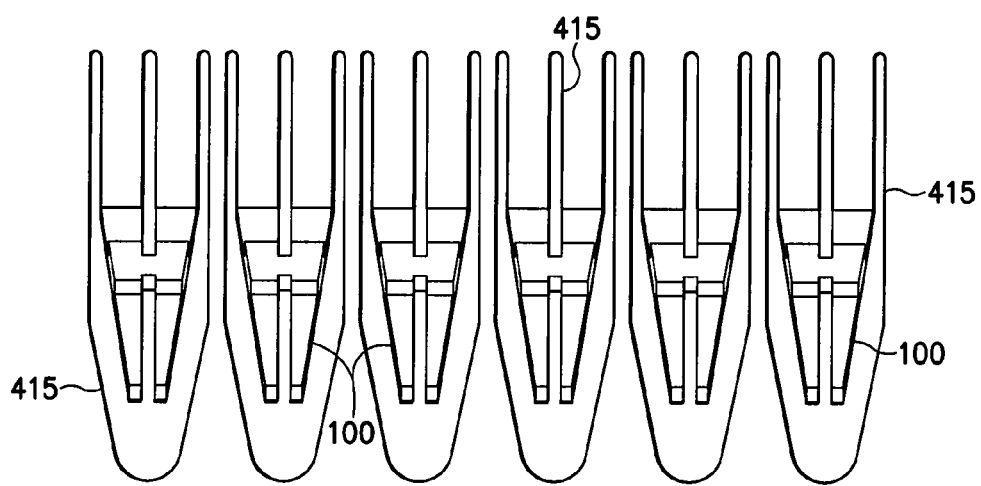
FIG. 5 is an expanded top view diagram of a portion of the text fixture of FIG. 4.
Figure 6:
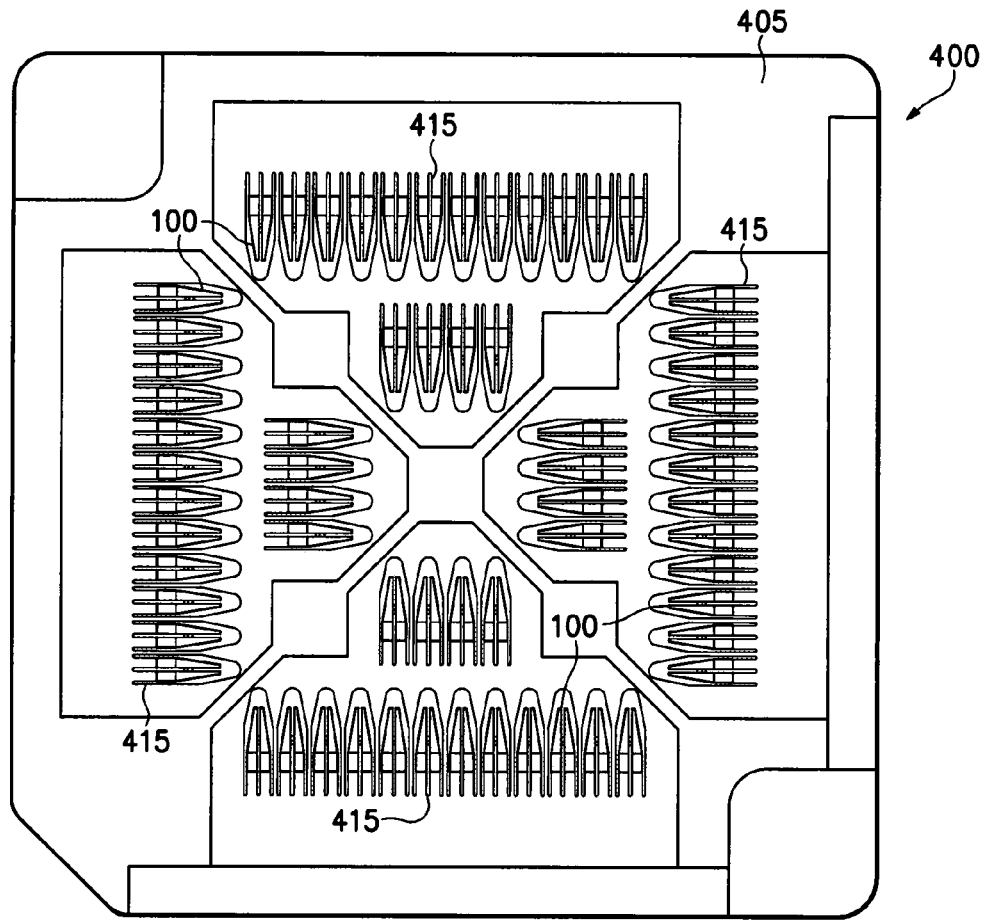
FIG. 6 is a bottom view diagram of the test fixture of FIG. 4.
Figure 7:
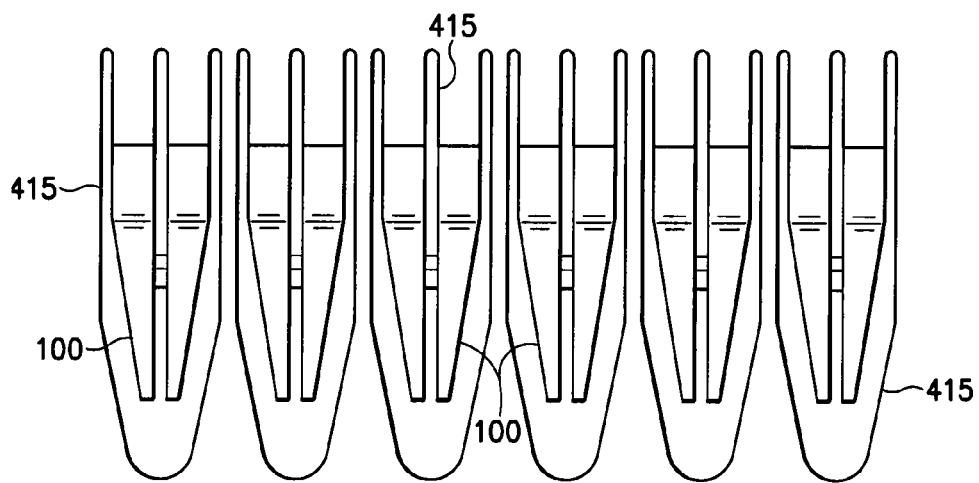
FIG. 7 is an expanded bottom view diagram of a portion of the text fixture of FIG. 4.

FIG. 4 is a top view diagram of a test fixture 400 including contact cells 100 in accordance with an example embodiment. FIG. 5 is an expanded top view diagram of a portion of the text fixture 400. FIG. 6 is a bottom view diagram of the test fixture 400. FIG. 7 is an expanded bottom view diagram of a portion of the text fixture 400. FIG. 8 is a front view diagram of the test fixture 400. FIG. 9 is an expanded front view diagram of a portion of the text fixture 400.

Referring to FIGS. 4-9, a test fixture 400 according to an example embodiment includes a flexible circuit board 405, hard stops 410, and multiple contact cells 100 arranged in rows and columns on the circuit board. The precise arrangement of the rows and columns of contact cells 100 on test fixture 400 will of course depend on the design of the particular leadless package that the text fixture is intended to be used with. As illustrated in FIG. 4, the extreme ends of the tips 105 of the contact cells 100 in each row and column of contact cells is substantially arranged in a straight line, but this is not strictly required among all embodiments. While the arrangement shown in FIG. 4 is preferred for some conventional leadless packages, such as QFN packages, where the lands or pads of the package are also arranged in corresponding rows and columns, alternative embodiments need not have contact cells 100 arranged precisely in rows and columns. Most generally, the precise arrangement for each of the contact cells 100 will depend on the arrangement of the individual lands or pads of the leadless package that the test fixture is designed to test.

Referring to FIG. 9, the flexible circuit board 405 of the test fixture 400 further includes a shim layer 420, a polyimide layer 425, and electrical leads or traces 430. Preferably, the shim layer 420 is also composed of polyimide, so practically speaking the shim layer 420 and polyimide layer 425 can be considered a single structural layer, where the purpose of the shim layer portion of the single structural layer is to make the flexible circuit board 405 to be coplanar with the target circuit board (not shown).

The bases 110 of the contact cells 100 are in contact with the electrical traces 430. It should be clear that the electrical traces 430 are used to electrically connect the contact cells 100 to processing components (not shown) that may or may not be included in the test fixture 400. As the arrangement of the electrical traces 430 is not particularly relevant to the inventive aspects of the example embodiments, it will not be discussed further.

Referring to FIGS. 4-7, the test fixture 400 additionally includes slits 415 that are cut into the surface of the polyimide layer 425. The slits 415 increase the independence between the tips 105 of the contact cell 100, for the following reason. Because the bases 110 of the first element 115 and the second element 120 of the contact cell 100 are both held by the polyimide layer 425, actuating one tip 105 of the contact cell 100 may cause the other tip 105 of the contact cell 100 to move. In other words, it was found that a mechanism is needed to allow one tip 105 of the contact cell 100 to move independently of the other tip 105 of the contact cell. The slits 415 in the polyimide layer 425 provide such a mechanism. The slits 415 significantly reduce the effect of movement in the first element 115 in response to movement by the second element 120.

The test fixture 400 also includes one or more fasteners (not shown) that are used to hold the fixture in the correct position relative to the target circuit board (not shown). A variety of conventional fasteners, the details of which may be found elsewhere, are suitable for accomplishing this purpose.

The hard stops 410 of the test fixture 400 are used to limit the distance that a DUT may approach the circuit board 405. Therefore, the amount of force that is applied to the tips 105 of the contact cells 100 by the DUT is also limited by the hard stops 410. The inherent flexibility of the contact cells 100, however, ensures that the tips 105 remain in physical and electrical contact with the planar lands or pads of the DUT. Because the design of this example embodiment has been found to deliver a relatively low contact force of less than 8 (eight) grams per contact cell 100, the lifespan of the contact cell is advantageously increased, reducing associated test costs. The relatively low contact force that is applied to the contact cells 100 also results in reduced damage to the target circuit board (not shown), which also increases lifespan of the test fixture and reduces the associated test costs.

FIG. 10 is a flowchart illustrating some example processes in a method 1000 of manufacturing a test fixture that electrically connects a device-under-test (DUT) that is inserted in the test fixture to electrical traces on a circuit board. Referring to FIG. 10, the method 1000 includes the process 1010 of manufacturing first conductive elements. The first conductive elements have substantially the same size and shape, and include a base portion, a bend portion, and a tip portion. The method 1000 also includes the process 1020 of manufacturing second conductive elements. Like the first conductive elements, the second conductive elements have substantially the same size and shape. The second conductive elements also include a base portion, a bend portion, and a tip portion.

The method 1000 further includes the process 1030 of attaching each one of the first conductive elements to one of the second conductive elements using a non-conductive tie to form contact cells having substantially the same size and shape, where the contact cells include a base portion, a bend portion, and a tip portion. The base, bend, and tip portions of each of the contact cells include the base, bend, and tip portions, respectively, of each of the corresponding first and second conductive elements. The method 1000 further includes the process 1040 of attaching the base portions of the contact cells to the flex circuit board 405 such that each of the contact cells is in electrical contact with at least one electrical trace on the target circuit board (not shown). There may be other processes included in the method 1000 besides processes 1010-1040, and the illustrated processes need not be performed in the order shown.

It should be emphasized that the example embodiments described and illustrated in this disclosure were presented for purposes of illustration, and not for limitation. It will be apparent to those of ordinary skill that various modifications and changes may be made to the example embodiments described without departing from the principles of one or more inventive aspects that exist in all embodiments, as defined in the attached claims.

The invention claimed is:

1. A contact cell comprising:
   a first element that is flexible and electrically conductive, the first element structured to have at least one bend along an entire length of the first element;
   a second element that is flexible and electrically conductive, the second element structured to have at least one bend along an entire length of the second element;
   a tie that is electrically non-conductive, the tie affixed to each element in a set of elements, the set of elements consisting of the first element and the second element, such that the first element and second element are physically and electrically separated from each other;

wherein the first element comprises a tip portion that is structured to contact a land of a leadless package and a base portion that is structured to contact a first electrical trace on a circuit board, and wherein the tip portion and the base portion are separated by the bend;

wherein the base portion of the first element is configured to remain fixed in response to a force on the tip portion of the first element directed towards the circuit board, and the tip portion of the first element is configured to flexibly follow a path substantially described by an arc relative to the base portion of the first element in response to the force on the tip portion of the first element; and wherein the second element comprises a tip portion that is structured to contact a second land of the leadless package and a base portion that is structured to contact a second electrical trace on the circuit board.

2. The contact cell of claim 1, wherein the tip portion of the first element is substantially narrower than the base portion of the first element.

3. The contact cell of claim 1, the first element symmetric to the second element, the tie affixed to the first element and the second element such that the symmetry between the first and second elements is a mirror symmetry about an axis.

4. The contact cell of claim 3, the tie structured to be symmetric about the axis.

5. A test fixture comprising:
  a circuit board that includes a first electrical trace and a second electrical trace;
  a first conductive element disposed on the circuit board;
  a second conductive element disposed on the circuit board;
  a base portion of the first conductive element, the base portion of the first conductive element proximate to the circuit board and in electrical contact with the first electrical trace;
  a base portion of the second conductive element, the base portion of the second conductive element proximate to the circuit board and in electrical contact with the second electrical trace;
  a tip portion of the first conductive element, the tip portion of the first conductive element distal to the circuit board and relatively flexible;
  a tip portion of the second conductive element, the tip portion of the second conductive element distal to the circuit board and relatively flexible, the tip portion of the first conductive element and the tip portion of the second conductive element are configured to physically contact respective first and second lands of a Device Under Test (DUT) that is inserted in the test fixture;
  a bend portion of the first conductive element, the bend portion of the first conductive element arranged to join the base portion of the first conductive element to the tip portion of the first conductive element at an angle;
  a bend portion of the second conductive element, the bend portion of the second conductive element arranged to join the base portion of the second conductive element to the tip portion of the second conductive element at the angle; and
  a tie that is attached to each element in a set of elements, the set of elements consisting of the first conductive element and the second conductive element, the tie structured to hold the first conductive element apart from the second conductive element, the tie including a nonconductive material;
  wherein the base portion of the first conductive element is configured to remain fixed in response to a force on the tip portion of the first conductive element directed towards the circuit board, and the tip portion of the first conductive element is configured to flexibly follow a path substantially described by an arc relative to the base portion of the first conductive element in response to the force on the tip portion of the first conductive element.

6. The test fixture of claim 5, the first and second conductive elements structured and arranged such that one is substantially a mirror image of the other about an axis.

7. The test fixture of claim 6, wherein the tie exhibits mirror symmetry about the axis.

8. The test fixture of claim 5, the base portions of the first and second conductive elements wider than the tip portions of the first and second conductive elements.

9. The test fixture of claim 5, further comprising hard stops arranged to prevent the DUT from applying an excessive force to the tip portions of the first and second conductive elements.

10. A method of manufacturing a test fixture that electrically connects a device-under-test (DUT) that is inserted in the test fixture to electrical traces on a circuit board, the electrical traces including at least one first electrical trace and at least one second electrical trace, the method comprising:
  manufacturing first conductive elements having substantially the same size and shape, the first conductive elements including a base portion, a bend portion, and a tip portion, the tip portions of the first conductive elements being structured to contact at least one first land disposed on the DUT, the base portions of the first conductive elements being structured to contact the at least one first electrical trace;
  manufacturing second conductive elements having substantially the same size and shape, the second conductive elements including a base portion, a bend portion, and a tip portion, the tip portions of the second conductive element being structured to contact at least one second land disposed on the DUT, the base portions of the second conductive element being structured to contact the at least one second electrical trace;
  attaching a non-conductive tie to each element in a set of elements to form contact cells having substantially the same size and shape, the set of elements consisting of one of the first conductive elements and one of the second conductive elements, the contact cells including a base portion, a bend portion, and a tip portion, the base portion of each of the contact cells including the base portions of a corresponding first conductive element and a corresponding second conductive element, the bend portion of each of the contact cells including the bend portions of the corresponding first conductive element and the corresponding second conductive element, the tip portion of each of the contact cells including the tip portions of the corresponding first conductive element and the corresponding second conductive element; and
  attaching the base portions of the contact cells to the circuit board such that each of the contact cells is in electrical contact with the at least one first electrical trace and the at least one second electrical trace;
  wherein the base portion of the first conductive element is configured to remain fixed in response to a force on the tip portion of the first conductive element directed towards the circuit board, and the tip portion of the first conductive element is configured to flexibly follow a path substantially described by an arc relative to the base portion of the first conductive element in response to the force on the tip portion of the first conductive element.

11. The method of claim 10, wherein attaching the base portions of the contact cells to the circuit board comprises:
  forming slots in an upper surface of the circuit board, the electrical traces disposed at a bottom of the slots; and
  inserting the base portions of the contact cells into the slots such that the base portions are in contact with the electrical traces.

12. The method of claim 11, wherein manufacturing the first and second conductive elements comprises:
  manufacturing the base portions of the first and second conductive elements such that they are substantially planar; and
  manufacturing the tip portions of the first and second conductive elements such that they are substantially planar.

13. The method of claim 11, wherein attaching the base portions of the contact cells to the circuit board comprises attaching the base portions of the contact cells to the circuit board such that the distal ends of the tip portions of the contacts cells are arranged in a substantially straight line.

14. The method of claim 13, further comprising placing hard stops on the circuit board, the hard stops configured to limit an extent to which the DUT can be inserted into the test fixture.

15. The method of claim 14, wherein the distal ends of the tip portions of the contact cells extend beneath the DUT by a predetermined amount to physically contact the respective at least one first land and the respective at least one second land disposed on the DUT when the DUT is inserted into the test fixture to the extent allowed by the hard stops.

* * * * *